United States Patent [19]

Whittaker et al.

[11] Patent Number: 5,087,839
[45] Date of Patent: Feb. 11, 1992

[54] METHOD OF PROVIDING FLEXIBILITY AND ALTERABILITY IN VLSI GATE ARRAY CHIPS

[75] Inventors: Bruce E. Whittaker, Mission Viejo; Saul Barajas, Capistrano Beach, both of Calif.

[73] Assignee: Unisys Corporation, Blue Bell, Pa.

[21] Appl. No.: 593,175

[22] Filed: Oct. 5, 1990

[51] Int. Cl.[5] .......................................... H03K 19/177
[52] U.S. Cl. .................................... 307/465; 307/441; 364/491
[58] Field of Search ................ 307/441, 465, 468–469, 307/249, 449, 272.2; 357/45; 364/490–491

[56] References Cited

U.S. PATENT DOCUMENTS

| | | | |
|---|---|---|---|
| 4,721,868 | 1/1988 | Cornell et al. | 307/465 |
| 4,800,302 | 1/1989 | Marum | 307/441 |
| 4,899,067 | 2/1990 | So et al. | 307/441 X |
| 4,908,525 | 3/1990 | Yung | 307/441 X |
| 4,987,325 | 1/1991 | Seo | 307/465 |
| 4,990,800 | 2/1991 | Lee | 307/465 |

Primary Examiner—David Hudspeth
Attorney, Agent, or Firm—Alfred W. Kozak; Mark T. Starr

[57] ABSTRACT

A method and technique for inserting additive logic and flip-flops into the architecture of a gate array chip package whereby spare input and output pins can later be used to alter the logic functions by either disabling or enabling certain logic units internal to the chip by external signal injection.

11 Claims, 7 Drawing Sheets

SIGNAL1 = A+B+C+-----+SPAREPIN1/

FIG. 8

METHOD OF PROVIDING FLEXIBILITY AND ALTERABILITY IN VLSI GATE ARRAY CHIPS

FIELD OF THE INVENTION

This disclosure provides a method for architectural enhancement of custom VLSI (Very Large Scale Integration) gate array chips in order to provide reconfiguration flexibility of the internal architecture so as to eliminate the necessity of having to initiate a re-design cycle.

BACKGROUND OF THE INVENTION

Figure 1:
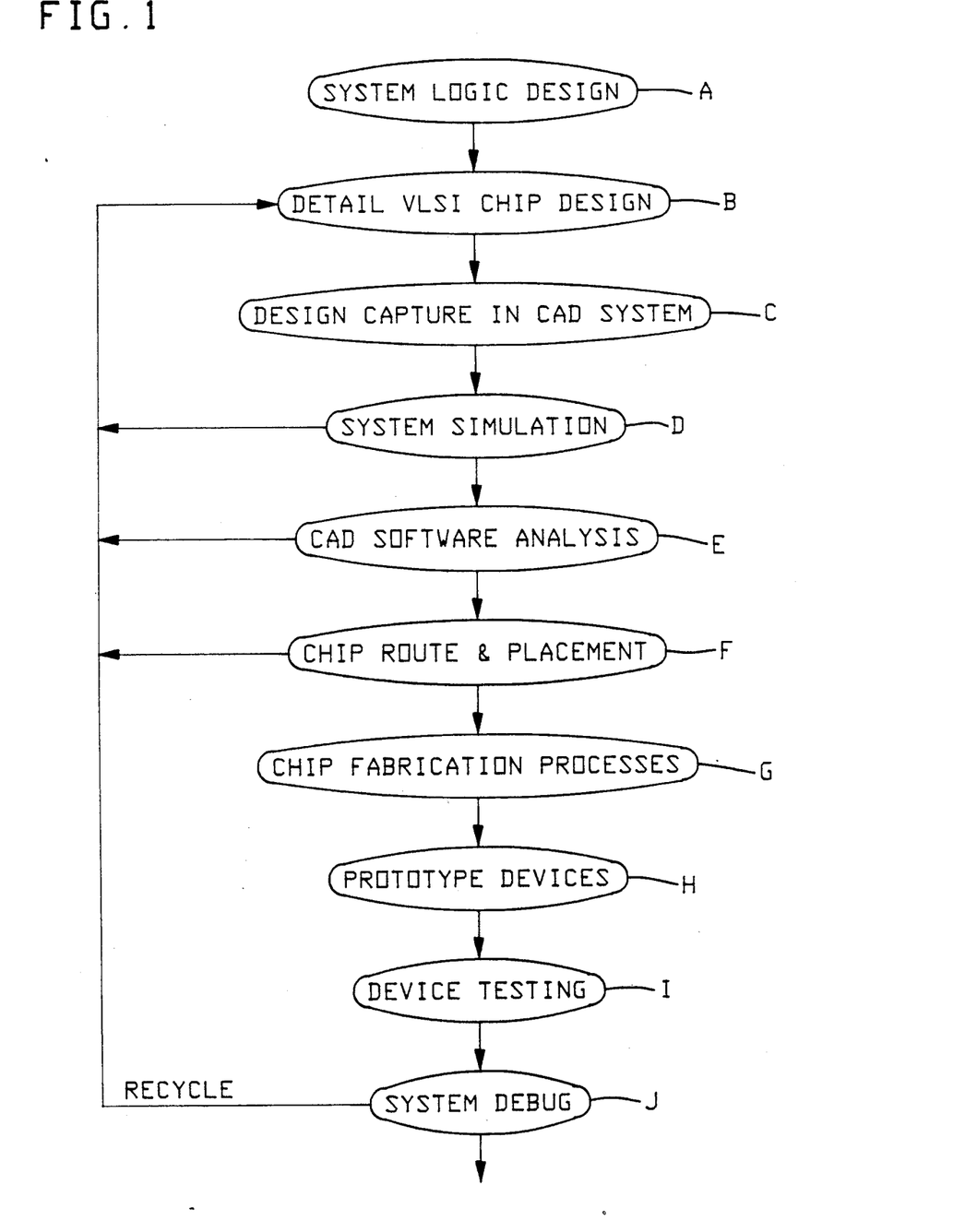
FIG. 1 is a flow chart indicating the various steps in the design cycle of a custom VLSI chip or logic device.

As seen in FIG. 1, the design cycle for a VLSI device involves a series of steps such as that indicated by step A, B, C, . . . J. The time factor in this design cycle may involve periods of 8 to 10 weeks to reach the point of step J which is the system debug operation.

During the "debug" phase of any logic system development, it is always necessary to make hardware changes as various logic "bugs" are found. That is to say, when the originally designed system does not operate as required or system perform as later-realized requirements necessitate.

When the hardware of a system is implemented in standard SSI (Small Scale Integration) and in MSI (Medium Scale Integration) logic chips on logic boards, the necessary hardware changes can often be done quickly by the "cutting" of the board etch and the adding on of patch wires.

As the generation of custom VLSI gate array chips become more and more a part of system logic design, then the hardware changes may be difficult or impossible to effectuate. If the changes are "external" to the VLSI chip, then the formerly known techniques of "cutting and adding" can then be used, but, if the problem is found to reside "internally" to the VLSI device, then the physical changes required cannot be done in a short time frame since then, the VLSI design must be "recycled" through the VLSI design cycle shown in FIG. 1 with steps A, B, c, . . . H, I, J having to be reformulated.

This cycle may take as long as another 8 to 10 week period, as previously mentioned, in order to get a new set of prototype chips so that the system debug operation at step J of FIG. 1, can then continue. These types of delays are normally not acceptable in a design schedule for a system.

The simulation phase at step D of FIG. 1 of the design cycle is intended to help eliminate logic errors in the VLSI chip device. A careful, extensive, and intelligent approach to this phase can reduce the possibility of errors. However, experience has shown that rarely is it possible to simulate all the possible and necessary system functions and architecture that will be required for the final operating system.

The present disclosure provides a method of architectural arrangement to overcome the problems encountered in preliminary design when it is not possible for the logic designer to anticipate all the future problem areas or even to anticipate unknown requirements which may show up later. Thus a flexible and alterable design is the lifesaving solution or, that is to say, the design-saving solution during the course of the custom VLSI development cycle.

SUMMARY OF THE INVENTION

The present method of flexible architectural arrangement provides for the use of various spare pin connections for the type package selected, to be used to connect or disconnect certain surplus internal circuitry which have been added into the gate array chip.

Thus, added to the normal logic circuitry of the VLSI chip, there is included a number of flip-flops which are taken to certain spare (unused) gate array pin connections which can be used to stimulate or trigger the added signal logic units. One set of so called "soft" set/reset spare flip-flops can be connected to a spare output pin which can be initiated by some newly added command signals in order to set and reset the spare flip-flops and where each spare flip-flop has an output connected to an output spare pin of the gate array. The usage of these flip-flops will be undefined and can be defined as necessary during step J of the system debug operation.

Another type of added logic could be "hard" set/reset spare flip-flops. These use spare input pins to the chip in order to set and reset a spare flip-flop. This permits signals "external" to the gate array to be connected at a later time to set and reset the flip-flop and to provide an output signal at a signal output pin that was previously unused.

DESCRIPTION OF PREFERRED EMBODIMENT

It is a most desirable feature in the designed methodology of VLSI chips, to make the chips "flexible" and to be able to alter their functions thus preventing the necessity of having to "recycle" or redesign a semi-completed gate array chip when system debug operations indicate that changes in function are necessary.

It should be noted that typical custom VLSI gate arrays may contain from 10,000 to 60,000 gate equivalents. These chips are generally packaged in standard chip package sizes where the chip package has various numbers of pin connections, both input pins and output pins. These packages may involve from as few as 40 signal pin connections total up to as many as 400 signal pin connections into and out of the package.

It is rare that all the possible logic gate units within a custom gate array are used. Similarly it is rare that all the available pin connections (for the package type selected) are used. Thus the added chip flexibility can be accomplished by the architectural techniques described herein, and will utilize some of the spare (unused) package pin connections and also use a small amount of the available logic located within the chip device.

The methodology for providing flexibility of the gate array package requires the logic designer, generally, to anticipate possible areas of the gate array logic which may require changing or expanding during the system debug operation. It is quite usual that system interfaces are not completely defined or understood at the time of the initial VLSI chip design. It is always hoped that the chip designer may anticipate the need for future functions in certain areas and it is certainly desirable that there be provided flexibility into the designed gate array long in advance of the finally decided functions and operations of the chip.

Figure 2:
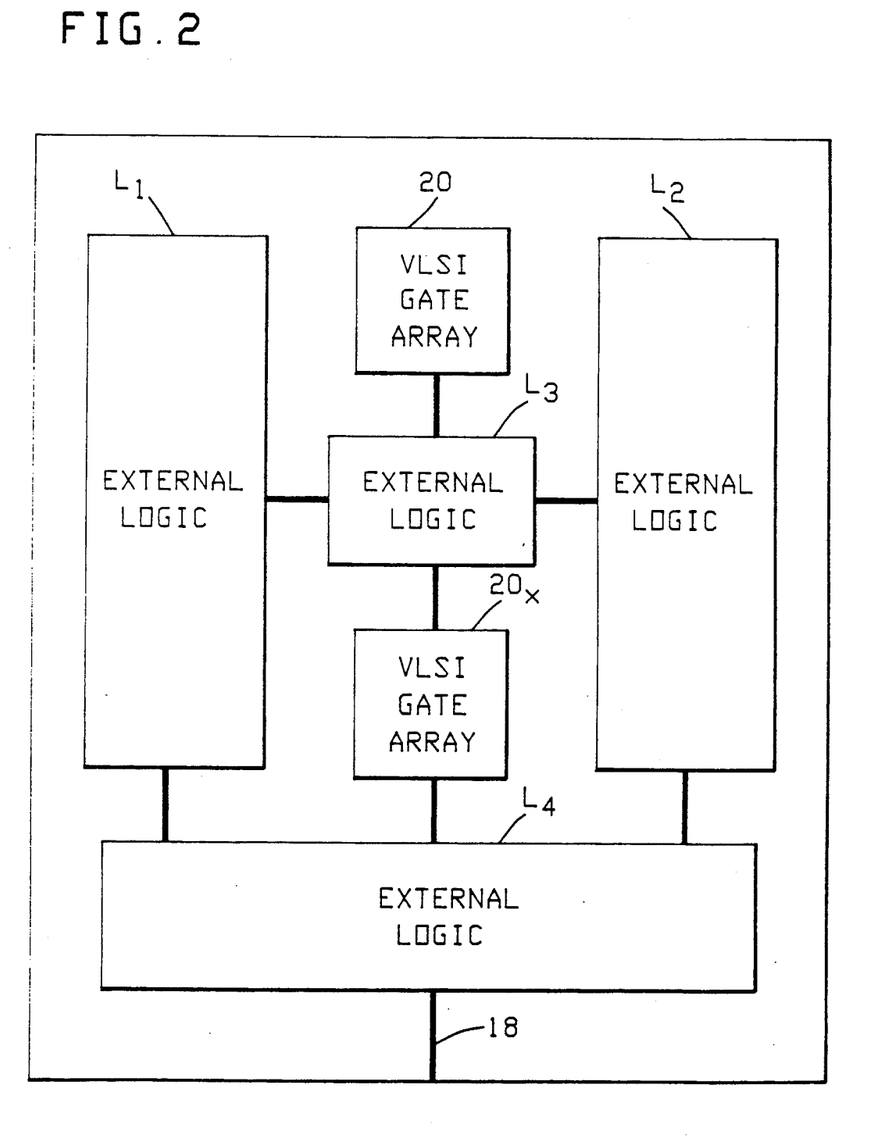
FIG. 2 is a schematic showing how gate array chips may be used and interconnected on a system logic board to cooperate with external logic.

As seen in FIG. 2 there is observed a general block diagram of a system logic board which contains several VLSI gate array chips such as 20 and $20_x$. Additionally it is seen that these gate array chips are connected to external logic units ($L_1$, $L_2$, $L_3$, $L_4$,) such as SSI Units (small scale integration) and MSI (medium scale integration). When it is known that "debug" changes are possible in the "external logic" but are not possible in the VLSI gate array chip devices, the designer should be able to use the chip package "spare pins" to permit logic changes within the VLSI chip.

The present architectural additives and methodology presents two general ways of building the required flexible logic for gate array chips. These are:
(1) flexible (programmable) flip-flops;
(2) flexible gated logic.

Figure 3:
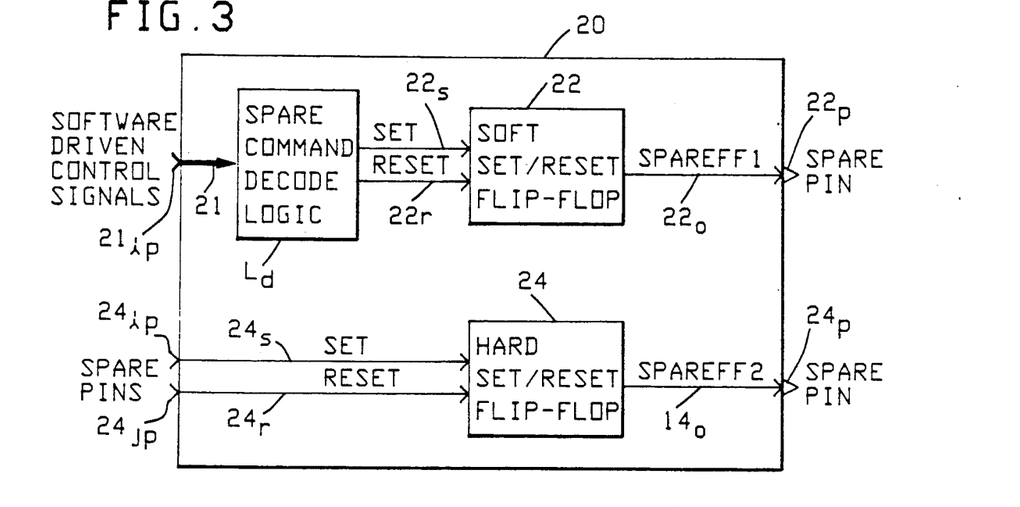
FIG. 3 is a drawing indicating two different types of flip-flops as additives to the normal logic of a gate array chip and which can be used at a later time to make logic changes.

Referring to FIG. 3 there are shown two types of flip-flops that can be added to the VLSI gate array architecture. One type is the "soft" set/reset flip-flop 22 and the second type is the "hard" set/reset flip-flop 24. These types of additive circuitry can be used at a "later time" in order to make desirable logic changes. The output of each of these flip-flops such as 22 and 24 can be taken to a spare (unused) gate array pin such as $22_p$ and $24_p$ shown in FIG. 3. Additionally the output of each of these flip-flops can be used as part of the internal gate array signal logic of the flip-flop 26 in FIG. 4.

The soft set/reset flip-flop 22 shown in FIG. 3 is seen to have an output line $22_o$ which goes to the spare pin $22_p$. The flip-flop 22 has a "set" input $22_s$ and a "reset" input $22_r$ which comes from the spare command decoder logic $L_d$. The control signals coming in on bus 21 into the decoder logic $L_d$ operate via software driven control signals on input pin $21_{ip}$.

The gate array chips in array 20 and $20_x$ (FIG. 2) could be involved with any type of package unit such as the dual in line package (DIP) the SIP, the PINGRID, or FLATPACK etc. or any type package deemed desirable.

The "soft" flip-flop 22 is under control of the software micro-code. To use it, the micro-code will output the spare commands which were not used previously. A possible use, is to create a new operation, for example, a new I/O OP which was never used before. The spare command might be set, to state "burst I/O". The new spare command to the "burst I/O flip-flop" will be set. This flip-flop can then be used with soft "external" logic. This would require no wiring change from the processor driving the micro-codes to the VLSI gate array 20.

A flip-flop is "hard" (such as flip-flop 24) because now, it is not controlled by micro-code but instead physically has a wire connected to the "set input" and to the "reset input".

In application and use for this flip-flop, this would occur when the print circuit board is in the debug stage and the design is complete but the board did not have logic in the external logic area thus, instead of adding another chip, it is possible to use the "spare" flip-flops.

If the gate array chip (as one of its normal functions) provides decoding logic of certain software driven bus signals, and if there are some spare decoders available, these can be used to define certain extra "spare" commands in order to set and reset the spare flip-flops. Table I hereinunder gives an example of types of spare decode signals used to set and reset the spare flip-flops. Each spare flip-flop has its output connected to an output spare pin such as $22_p$ $24_p$ etc. of the gate array 20 of the FIG. 3. Normally, the usage of these flip-flops will be undefined at the time of the original gate array design. However, later during system debug these flip-flops will be used via new software driven functions in order to change or alter the operating functions of the chip.

Table I is an example where four new soft set/reset spare flip-flops have been added to the gate array design. These flip-flops may be used at "DEBUG" time for new system needs or requirements. A general principle here involved is that one does not waste any software decode signal values in a gate array design but reserves them for later requirements decided to be useful at debug time.

TABLE I

| | NORMAL CHIP INPUTS | | |
|---|---|---|---|
| COMMAND LINES | SECONDARY COMMAND LINES | | COMMAND DEFINITIONS |
| 0 0 0 0 | x x x x | a | Command #1 |
| 0 0 0 1 | x x x x | a | Command #2 |
| 0 0 1 0 | 0 0 0 0 | a | Sub-Command #0 |
| | 0 0 0 1 | a | Sub-Command #1 |
| | 0 0 1 0 | a | Sub-Command #3 |
| | 0 1 0 0 | a | Sub-Command #4 |
| | 1 0 0 0 | b | Set Spare Flip - Flop 1 |
| | 1 0 0 1 | b | Reset Spare Flip - Flop 1 |
| | 1 0 1 0 | b | Set Spare Flip - Flop 2 |
| | 1 0 1 1 | b | Reset Spare Flip-Flop 2 |
| | 1 1 0 0 | b | Set Spare Flip - Flop 3 |
| | 1 1 0 1 | b | Reset Spare Flip - Flop 3 |
| | 1 1 1 0 | b | Set Spare Flip - Flop 4 |
| | 1 1 1 1 | b | Reset Spare Flip - Flop 4 |
| 0 0 1 1 | x x x x | a | Command #3 |
| .... | | | |
| .... | | | |
| .... | | | |

NOTE:
x x x x = don't care values
a = normal operational commands
b = new commands added (previously undefined)
.... = all remaining decodes are defined.

The second type of "hard" flip-flop such as 24 in FIG. 3 uses, for example, spare gate array connection pins such as $24_{ip}$ and $24_{jp}$ (FIGS. 3, 4) in order to set and reset the spare flip-flop 24. This "flexible design additive" provides a flip-flop which allows signals external to the gate array to be connected at a later time in order to set and reset the flip-flop 24 via the set/reset lines 24$_s$ and 24$_r$. The hard flip-flop 24 has an output line 24$_o$ which goes to the spare pin 24$_p$.

Figure 4:
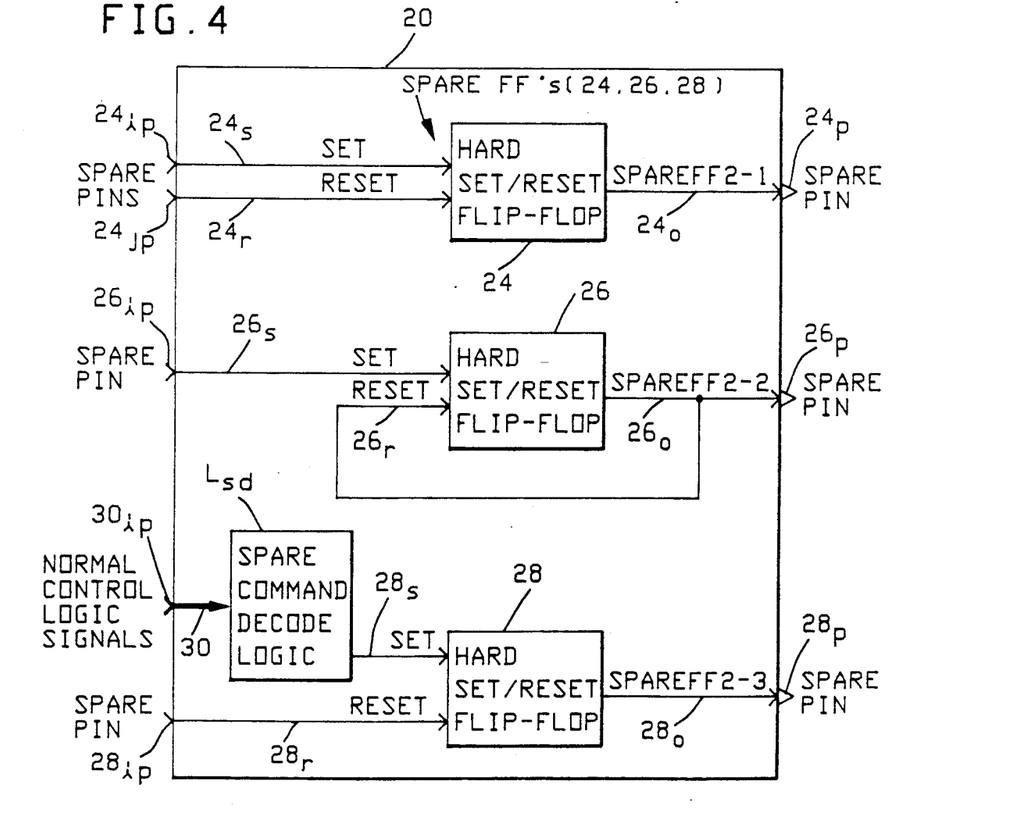
FIG. 4 is a schematic drawing showing three types of hard set/reset flip-flops which can be used as spares in the additive architecture.

FIG. 4 shows 3 varieties of the second type of flip-flops designated as "hard set/reset spare flip-flops". The first flip-flop 24 is identical to that shown in FIG. 3 in that this flip-flop has both the set and reset signals as new spare pin inputs (24$_{ip}$, 24$_{jp}$) to the gate array in FIG. 4.

The second flip-flop 26 shown in FIG. 4 uses its own output signal on line 26$_o$ to feed back internal information to the gate array and to act as its reset signal on line 26$_r$. This type of flip-flop can be used to produce a one clock time pulse when it is set on line 26$_s$ through the spare pin 26$_{ip}$.

The third flip-flop 28 of FIG. 4 in a sense combines the "soft" and the "hard" type spare flip-flops. The spare flip-flop 28 is set by a spare command decode logic unit L$_{sd}$ on line 28$_s$. The spare command decode logic receives its normal control logic signals through pin 30$_{ip}$ and on to bus 30. The reset to flip-flop 28 is done on signal line 28$_r$ through the spare input pin 28$_{ip}$.

APPLICATION USE FOR SPARE FLIP-FLOP 24 (FIG. 4)

The logic outside the VLSI chip 20 has been used up, it may be assumed. Thus there is no more room for additional chips. Now instead of the delaying the printed circuit board for redesign in order to add more chips we can use a flip-flop which is the hard spare flip-flop 24 of FIG. 4. This flip-flop will need 3 wires which involve 1 wire for each input and 1 wire for the output. This flip-flop is "hard" and is not under microcode control. This flip-flop can be "on" for as little as one clock period or any desired number of clock periods by controlling the reset input 24$_4$. The reset 24$_r$ is controlled from the outside or external to the package 20.

SPARE FLIP-FLOP 26 (FIG. 4)

Again this particular flip-flop is used for debug purposes. Thus when the printed circuit board is almost complete, but needs a flip-flop, as has been later realized, and it is not possible to add more chips then this flip-flop internal to the chip can be "set" from the outside of the chip but it will reset itself automatically on the next clock via the line 26$_r$. This flip-flop 26 generates a pulse which is a one clock wide pulse.

An application of this flip-flop would be to detect a condition such as a "memory cycle complete". The signal from memory may be coming too late to be sent directly to the processing unit. Therefore, it is first sent to the spare flip-flop 26, and then the output of the spare flip-flop 26 has a whole single clock in order to send "memory cycle complete" signal to the associated processor. This additive change requires only 2 additional wires shown in FIG. 4 as 26$_s$ and 26$_r$ in addition to the output line 26$_o$ to the spare output pin 26$_p$.

SPARE FLIP-FLOP 28 (FIG. 4)

The setting of this flip-flop 28 is controlled by microcode. The "resetting" is done by an additional externally connected wire 28$_r$. One application use of this flip-flop is to add a new operation to the chip via the spare flip-flop 28. For example in certain programs it was desired to add a new operation called "Burst I/O" which was needed to improve performance of the system. Since all the micro-code installed OPS were connected to the VLSI chip 20 then in order to provide for this operation, the micro-code was changed to set this particular spare flip-flop 28 to operate as a "burst I/O" command. As a result of this "external" control logic would now be in the "burst mode". When this I/O was completed, the external logic would reset, via 28$_r$, the spare flip-flop 28. This change required only the addition of two additional wire lines.

If this flip-flop 28 had not been used, it might have taken an extra complicated programmable array logic chip and possibly 10 connecting wires to do the job. The time to make the physical wiring changes and even provided there was appropriate space on the circuit board, would take approximately 4 hours. On the other hand with the use of the spare flip-flop 28, this alterable change could be done in about a half hour without the addition of any additional chips.

As an example of successful use of the "flexibility technique", the described system was used in the processor of the Unisys A series computer system A6-S. In the initial processor gate array design, seven "spare" flip-flops were added to the architecture. After all of the steps of the design cycle "A" thru "I", the system debug step J occurred and it was possible to define four of the spare flip-flops as an enhancement to the processor logic. Without these added spare flip-flops, it would have been required that the gate array architectural design would have required a recycling operation starting back from step "A" back to step "J" all over again.

The following Table II is an example of the use of spare flip-flops which lists the types described in FIGS. 3 and 4 in addition to their eventually defined usages.

In Table II the first column lists the spare flip-flop number while the second column shows the Type 1 as the "soft" flip-flop and the Type 2 as the "hard" flip-flop. The third column shows the usage and function defined for the spare flip-flop involved.

TABLE II

| SPARE FLIP-FLOP | TYPE | DEFINED USAGE |
| --- | --- | --- |
| SPAREFF1 | 1 | force Memory-Acknowledge condition |
| SPAREFF2 | 1 | test Status PALs logic |
| SPAREFF3 | 1 | Special I/O Burst Mode |
| SPAREFF4 | 2-2 | Clear PAL logic |
| SPAREFF5 | 2-3 | (undefined) |
| SPAREFF6 | 2-3 | (undefined) |
| SPAREFF7 | 2-3 | (undefined) |

Previously discussed was the concept of two general methods of building flexible gate array logic which involved (1) flexible (programmable) flip-flops; and (2) flexible gated logic.

The flexible gated logic of item (2) above is usable with a design technique that works on gated logic VLSI chips. The designer must select critical gate "terms" in the gate array and must add in the spare pin logic as described hereinafter.

Figure 5:
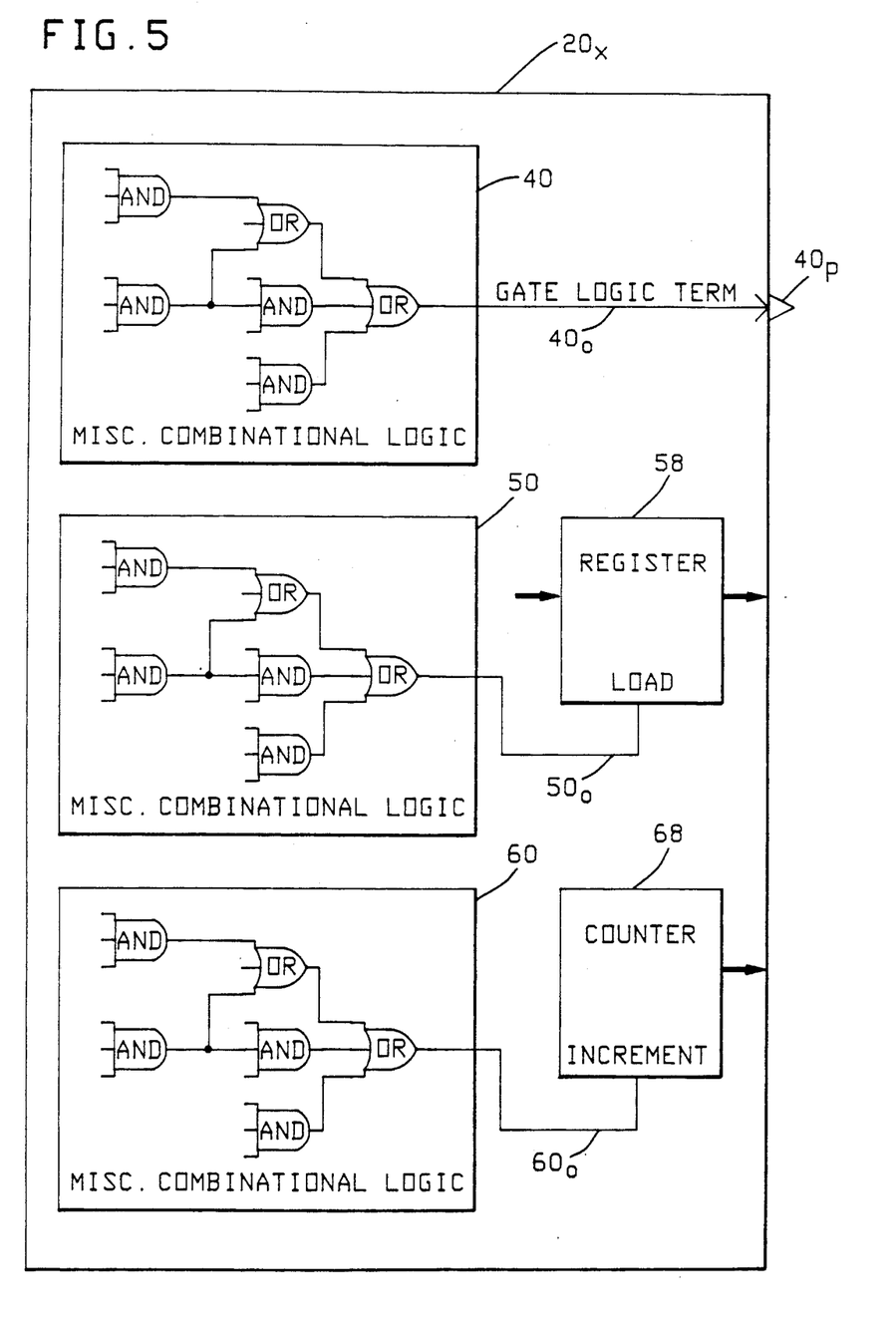
FIG. 5 is a schematic drawing indicating sample types of gate logic that could be used in a gate array chip with additive logic to make the chip flexible and alterable in function.

FIG. 5 shows several of the "gate logic" types that might be used in order to make the architecture "flexible and alterable". For example the first type of gate logic 40 shows a large "AND/OR" architectural structure which drives a gate logic term on line 40$_o$ on to the output pin 40$_p$.

Another type of gate logic 50 in FIG. 5 may provide necessary register load enable control signals (? What is the purpose of these signals?). For example here the register 58 has a input bus and output bus but the register 58 cannot be loaded until the enable signal on line $50_o$ is activated.

Another type of flexible gate logic unit could be that shown at 60 (FIG. 5) which provides the increment and decrement signals on line $60_o$ to the counter 68.

Thus by adding the flexible spare pin logic units to these gate structures, the logic can be modified during "debug time" without changing and redesigning the architecture of the gate array.

Figure 6:
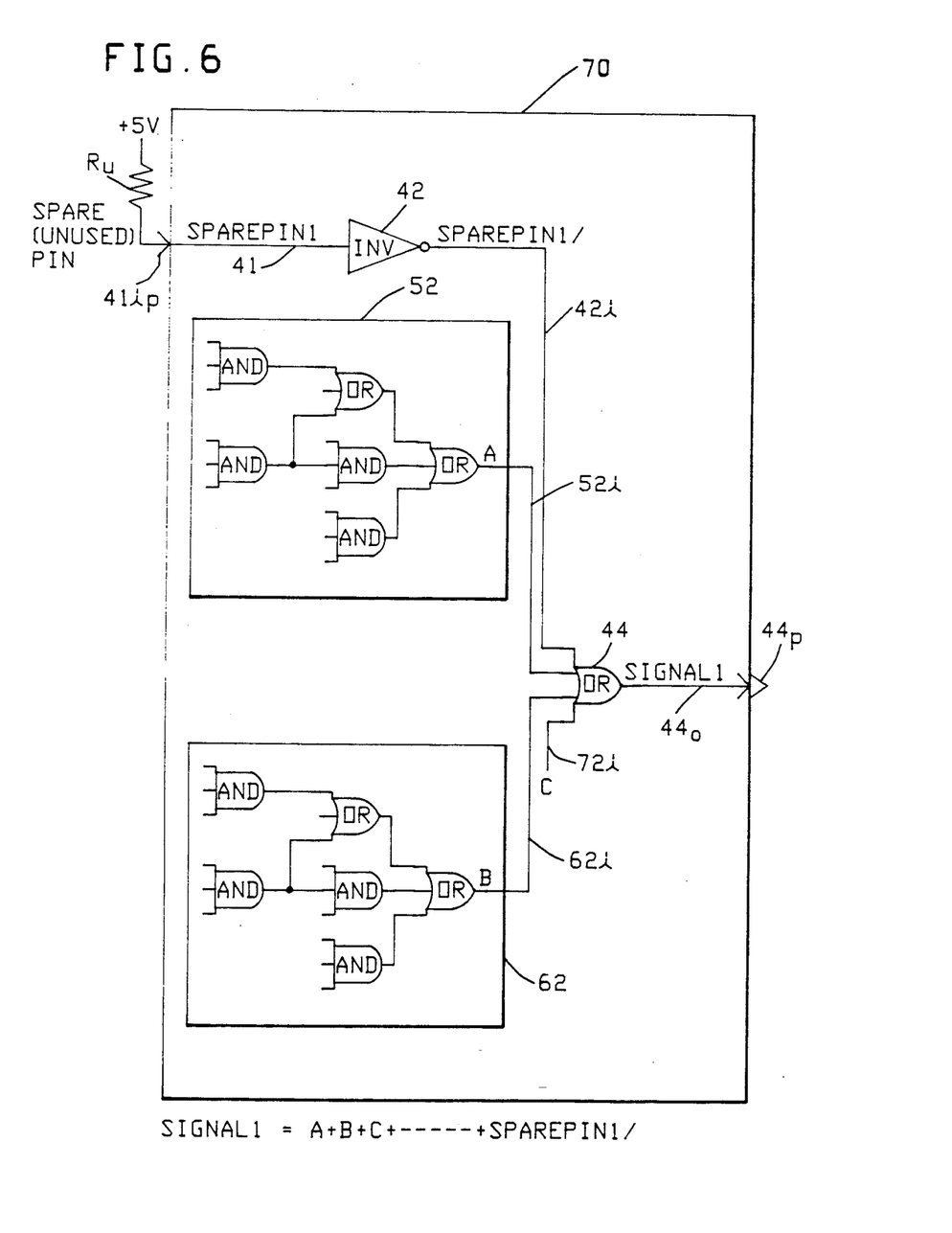
FIG. 6 is a schematic drawing showing how complex combinations of logic units can be "OR'd" with spare pin to make chip flexible and alterable.
Figure 7:
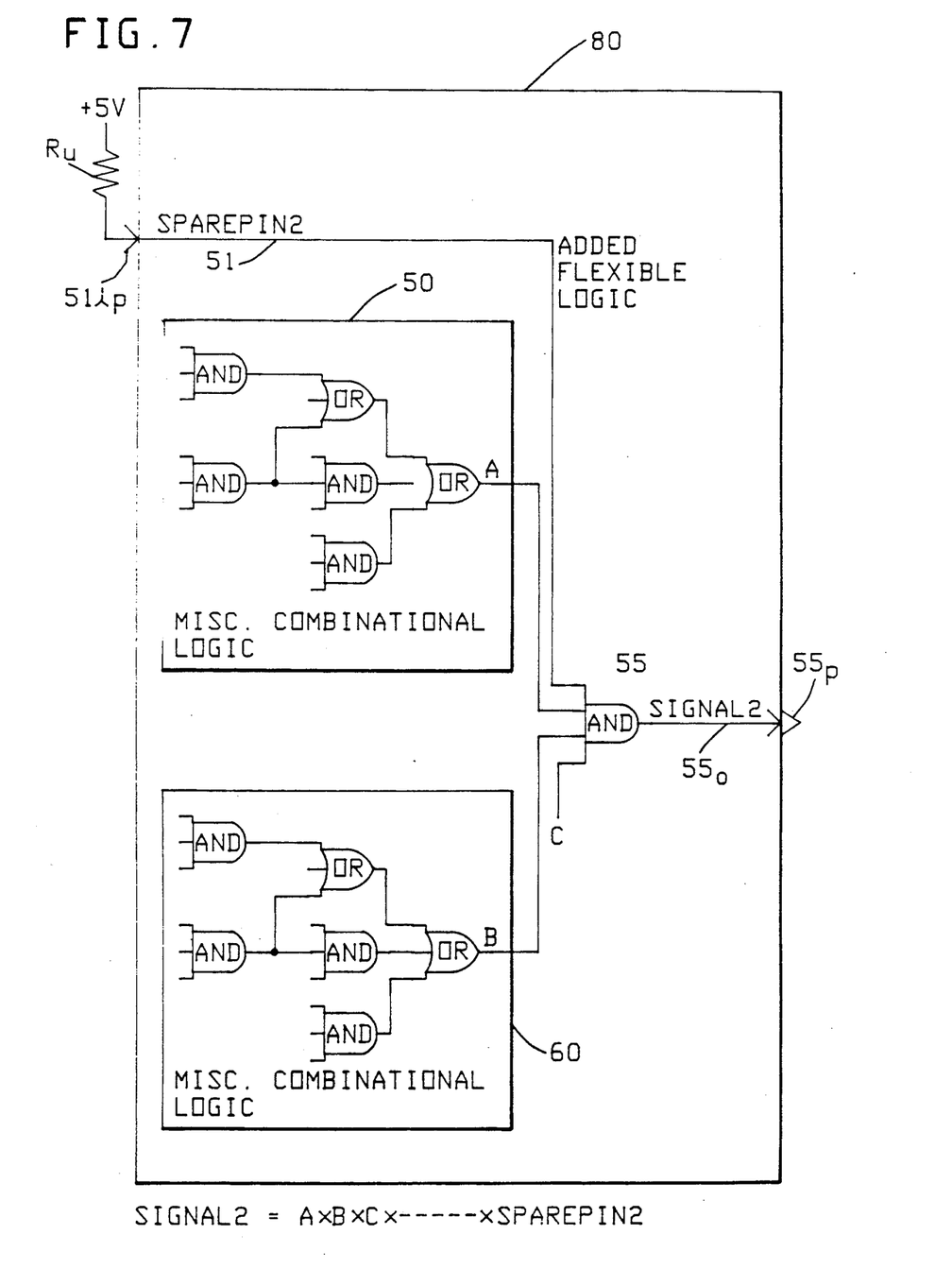
FIG. 7 is a schematic drawing showing how a spare pin logic technique can be added on to AND gate structures, with spare pins to make chip flexible and alterable.

FIGS. 5, 6, and 7 involve the types of logic called "combinatorial logic". Now we go to FIG. 5 and the VLSI gate array package 20". There are seen different types of combinatorial logic units 40, 50, and 60. These units 40, 50, and 60, are "non-flexible" or inflexible types of logic units such that in case of an unforeseen condition there would be no way of correcting the situation in these arrays except for going through a complete design recycle situation.

In FIG. 5 the register 58 and counter 68 are considered part of the "normal" circuitry inside the array $20_x$.

Thus FIG. 5 shows a "non-flexible" type of design which in the case of an error in any of the logic blocks 40, 50, and or 60 would cause the array to be unworkable and require a design recycling operation which would be very costly and time consuming.

Many control signals are a complex combination of logic equations which are "logically-OR'd" together. FIG. 6 shows such a possible structure. The output of the OR gate 44 provides an output designated Signal 1 on line $44_o$ which exits at the output pin $44_p$. The output Signal 1 is a combination of many other logic signals in the gate array which all pass through the final OR gate 44.

As seen in FIG. 6, there is added, to the ORgate 44, one additional OR condition. This is the new "flexible" spare signal on line 41 (Spare Pin 1) which is inserted through the spare (unused) pin $41_{ip}$. The signal line 41 carrying the spare pin 1 signal comes through the inverter circuit 42 into the gate array 70 of FIG. 6. On the outside of the gate array, this new signal pin, $41_{ip}$, is tied into the "high" condition through a pull-up resistor $R_u$. Under normal conditions the signal spare pin 1 has no effect on the final output Signal 1.

However, in the future testing and perhaps during the "debug operations", if external logic is connected to the gate array pin $41_{ip}$ in order to drive the Spare Pin 1 (line 41) to a logical "0", then it becomes a logical "1" at the input to the final ORgate 44 and therefore it activates the output Signal 1 at line $44_o$.

Thus the action of a very complex gated OR term, inside the gate array, can be "altered" by merely modifying the logic "external" to the gate array 70.

In FIG. 6 the combinatorial logic blocks 52 and 62 which is combined with the ORgate 44 is seen to be the "original" normal logic gates residing inside the VLSI array 70. The invertor 42 provides the means to add logic control to the ORgate 44 from the outside of the chip through the spare pin $41_{ip}$. Therefore, the extraneous additive logic involved herein is the invertor 42 combined with the signal pins 41, $42_i$, and the input pin $41_{ip}$. Pin $41_{ip}$ could also be used to add more logic control conditions from the outside of the array to the inside of the gate 44 within the array 70.

As seen in FIG. 6 the final OR gate 44 receives inputs on line $42_i$, on line $52_i$, on line $62_i$, and on line $72_i$.

Thus the Signal 1 will be activated if any one of the input lines to the final OR gate 44 has a different signal from the other input lines.

A methodology of using flexible spare pins and flexible additive logic within the gate array can also be used on "AND gate" structures. FIG. 7 shows a final AND gate structure 55 having an output SIGNAL 2 on line $55_o$ which exits at the output pin $55_p$. In FIG. 7, the output signal, SIGNAL 2, is a complex combination of gated terms being finally logically "ANDED" together. The added flexible spare pin signal term on $51_{ip}$ is called SPARE PIN 2 (line 51) which also is connected into the final AND gate 55. Thus in addition to the ordinary gate logic such as 50 and 60 of FIG. 7 there has been added the Spare Pin 2 signal which feeds to the AND gate 55 to form SIGNAL 2.

Thus the gate array package 80 of FIG. 7 having the combinational logic units 50 and 60 has been "added to" by inserting the spare 2 signal on line 51 into the output AND gate 55 to provide the SIGNAL 2 output.

The added flexible spare pin $51_{ip}$ is connected to a pull-up resistor $R_u$ in order to apply a voltage such as +5 volts to the Spare Pin 2 input line. Since the signal on line 51 (Spare Pin 2) is normally a logical "1" it has no effect on the functioning of the SIGNAL 2 output on line $55_o$.

However, at a later time, such as during debug operations, if external logic is added to drive this pin $51_{ip}$ to a logical "0" then the AND gate 55 is disabled.

Thus as will be noted in FIG. 7 the combinatorial logic units 50 and 60 together with the AND gate 55 are the "normal" internal logic in the array 80. The spare pin $51_{ip}$, the signal line 51, are the extraneous internally added logic which will then help to provide flexibility to the array.

If for example, it were found that additional logic was needed in the AND gate 55 then it would be simple to place logic "externally" into the spare pin $51_{ip}$ and thus provide more functionality at the AND gate 55 without the need to recycle the array 80 or to spend extra design time in debugging or recycling the operation.

The OR gate structures of FIG. 6 and the AND gate structures of FIG. 7 can also be combined to provide greater flexibility and alterability in this logic chip array package. This permits the designer, by "external logic" only, to disable the internal AND gates and also to activate the internal OR gates.

Figure 8:
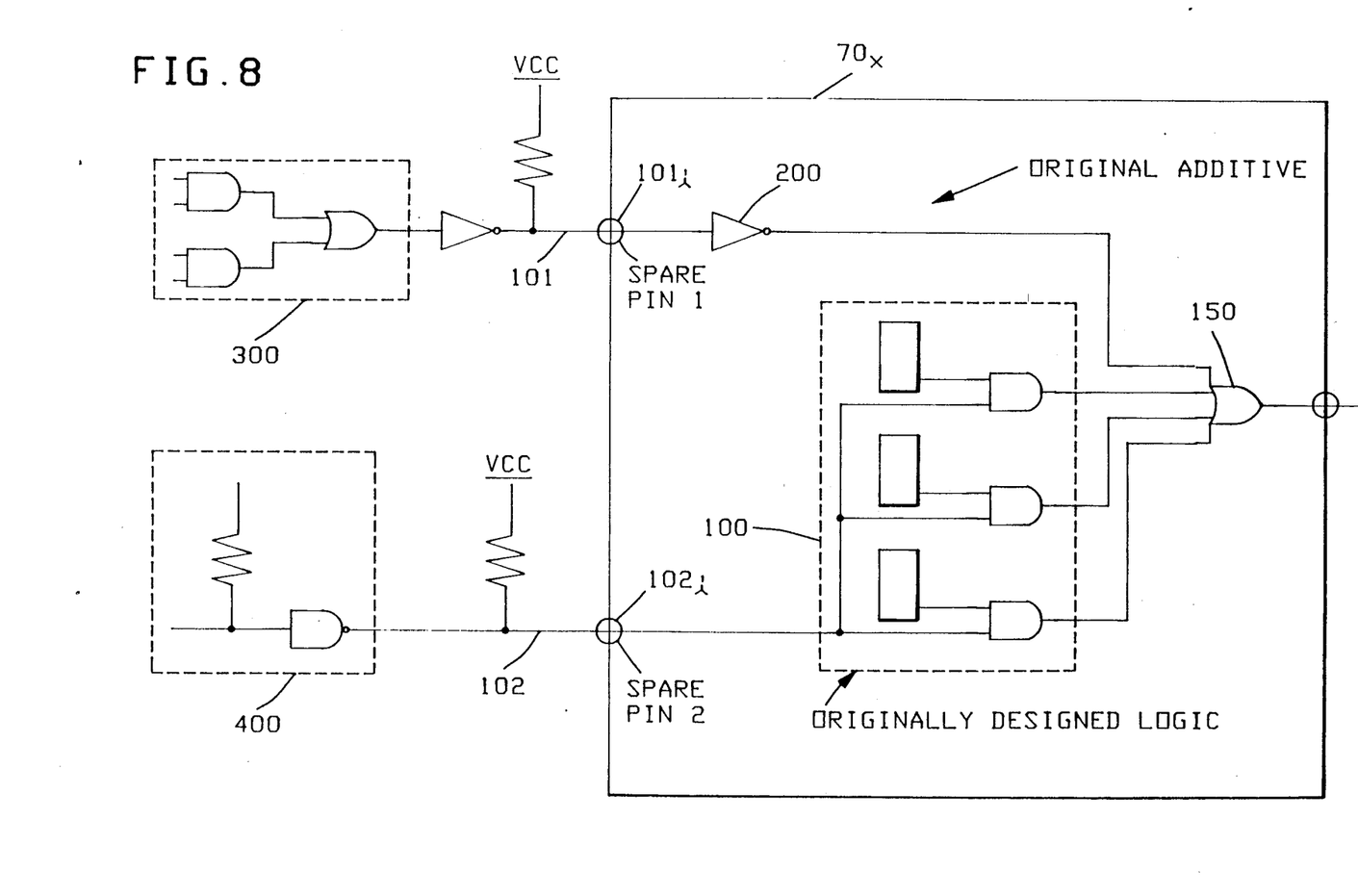
FIG. 8 is a schematic drawing showing the use of both "flexible OR" and "flexible AND" for development of a flexible and alterable logic array.

FIG. 8 is a diagram which indicates one way of recovering and implementing all the logic outside the gate array and disabling all the original logic residing inside the gate array. As seen in FIG. 8 the block 100 and the OR gate 150 are representative of the "original logic" designed within the array.

The second spare pin 102 provides the means to disable the logic block 100 by means of signals external to the array, that is to say from the outside. During normal operations, the spare pins 101, and 102, are pulled up to the voltage VCC allowing the internal logic to operate as originally intended. The logic block units 300 and 400 would not normally be present.

However, in order to "disable" the internal logic, the spare input pin 102 would be connected as a gate would a logic "low" from logic block 400. Then the spare pin 101 would have the new corrected logic contained in the new added logic block 300. Thus the array has the ability to be redesigned and all internal logic can be rearranged from an external portion of the gate array.

These techniques make themselves easy and rapid in order to implement them in the debug cite, such as in one day instead of requiring several weeks to redesign and recycle the gate array.

As an example of how these gate structure methodology could be used successfully, an example is herein given of the Unisys Corporation A6-S processor wherein 7 SPARE PIN signals were added into critical gate array internal gate signals. Then it was possible to use these additives during debug in order to modify the internal gate array logic by merely changing external hardware. The following Table III herein below gives an example of the SPARE PIN signals that were added into a typical gate array and shows a brief description of their usefulness.

TABLE III

| INPUT SPAREPIN SIGNAL | INTERNAL GATE | DESCRIPTION | EXTERNAL SIGNAL |
|---|---|---|---|
| SPAREPIN1 | OSEL (2) | selects data path flow | (unused) |
| SPAREPIN2 | OSEL (1) | selects data path flow | (unused) |
| SPAREPIN3 | OSEL (0) | selects data path flow | (unused) |
| SPAREPIN4 | LDINR | loads data-in register | MDVLDFF_B |
| SPAREPIN5 | LDINR | loads data-in register | (unused) |
| SPAREPIN6 | OPSEL | selects op-code value | (unused) |
| SPAREPIN7 | BUSCYCLE | OR gate of all cycles | (unused) |

Disclosed herein has been a methodology and technique of providing flexibility and alterability in the fabrication of custom VLSI gate array packages so that by careful planning and anticipation of potential problem areas, it is possible by the addition of the small amount of flexible spare pin logic units, to avoid the necessity of recycling the gate array design architecture back into a new design cycle and with the avoidance of the corresponding system scheduled delays and time problems.

What is claimed is:

1. A VLSI gate array package having normally used input and output pins comprising:
    (a) logic circuitry connected to said normally used input and output pins for executing predetermined functions;
    (b) redundant flip-flop circuitry connected to normally unused spare input and output pins;
    (c) means for controlling said redundant flip-flop circuitry to provide later—determined functions within said gate array package.

2. The package of claim 1 wherein said redundant flip-flop circuitry includes:
    (a) hard flip-flop means connected to external signal means to set or reset said flip-flop means and including:
        (a) output signal means from a flip-flop
        (a2) one or more flip-flops.

3. The package of claim 1 wherein said flip-flop circuitry includes:
    (a) soft flip-flop means controlled by externally generated software commands and including:
        (a1) one or more soft flip-flops each connected to outputs from redundant spare decoder means;
        (a2) redundant spare decoder means having inputs from spare, normally unused input pins on said gate array package and including:
            (a2a) outputs connected to said one or more flip-flops;
        (a3) output means from each said soft flip-flops to convey output signals to spare output pins on said gate array package.

4. The gate array package of claim 1 wherein said redundant flip-flop circuitry includes:
    (a) at least one hard flip-flop, said hard flip flop including:
        (a1) input lines for setting and resetting said hard flip flop
        (a2) output lines for conveying an output signal via spare output pins:
    (b) at least one soft flip-flop, said soft flip flop including:
        (b1) input lines from a spare decoder means to receive internally generated software commands;
    (c) spare decoder means connected to spare input pins on said gate array packages.

5. The package of claim 1 wherein said means for controlling includes:
    (a) externally generated control signals conveyed via spare pins on said package to said redundant flip-flop circuitry.

6. The package of claim 5 wherein said externally generated control signals includes:
    (a) set-reset signals for said redundant "flip-flop circuitry".

7. The package of claim 5 wherein said externally generated control signals include:
    (a) software commands for said redundant flip-flop circuitry.

8. A method of fabricating gate array chip packages comprising the steps of:
    (a) fabricating normal logic circuitry internal to said chip to satisfy the functions required during the initial evaluation of the needed architectural format for a gate array package;
    (b) adding redundant logic circuitry internally to said chip, said redundant logic circuitry being connected to spare, normally unused, pins;
    (c) using said spare pins to externally activate or in-activate said redundant logic circuitry so as to alter the functions of said normal logic circuitry.

9. A system for altering internal logic functions in a gate array chip package without need to redesign the internal logic circuitry, comprising in combination:
    (a) a gate array chip inserted in a protective package having multiple pins available for external connections, said package including; pins which are used for normally expected functions and spare pins which are normally unused;
    (b) gate logic normal circuitry fabricated internal to said chip and connected to said normally used pins to provide input and output signals;
    (c) extraneous internal logic circuitry connected to said normally unused pins, said extraneous internal logic circuitry connected to alter the operation of said normal circuitry upon activation by an external signal via said spare unused pins.

10. The system of claim 9 wherein said extraneous internal logic circuitry includes:
    (a) means, connected to a normally spare unused pin, for causing said internal normal gate circuitry to become inactive.

11. The system of claim 9 wherein said extraneous internal logic circuitry includes:
    (a) means, connected to a normally unused spare pin, for causing said internal normal gate circuitry to become active.

* * * * *